United States Patent [19]

Nishida et al.

[11] Patent Number: 4,541,091
[45] Date of Patent: Sep. 10, 1985

[54] CODE ERROR DETECTION AND CORRECTION METHOD AND APPARATUS

[75] Inventors: Masami Nishida, Yokohama; Keizo Nishimura, Yokosuka; Takao Arai; Nobutaka Amada, both of Yokohama, all of Japan

[73] Assignee: Hitachi, Ltd., Tokyo, Japan

[21] Appl. No.: 502,634

[22] Filed: Jun. 9, 1983

[30] Foreign Application Priority Data

Jun. 11, 1982 [JP] Japan .................................. 57-99201
Jun. 11, 1982 [JP] Japan .................................. 57-99203

[51] Int. Cl.$^3$ ........................................... G06F 11/10
[52] U.S. Cl. .......................................... 371/39; 371/5
[58] Field of Search ...................... 371/38, 39, 40, 37, 371/5

[56] References Cited

U.S. PATENT DOCUMENTS

| | | | |
|---|---|---|---|
| 4,380,071 | 4/1983 | Odaka | 371/40 |
| 4,413,339 | 11/1983 | Riggle et al. | 371/38 |
| 4,413,340 | 11/1983 | Odaka et al. | 371/39 |
| 4,451,920 | 5/1984 | Hoshimi et al. | 371/40 |
| 4,476,562 | 10/1984 | Sako et al. | 371/39 |

FOREIGN PATENT DOCUMENTS

2079994 1/1982 United Kingdom.

Primary Examiner—Charles E. Atkinson
Attorney, Agent, or Firm—Antonelli, Terry & Wands

[57] ABSTRACT

Method and apparatus for detecting and correcting code errors in processing a digital signal such as a digital audio signal are disclosed. An error word correcting parity word generated from a plurality of data words is added to the plurality of data words to form a first frame, and the data words and the parity word of a plurality of different first frames are distributed in a second frame and a plurality of additional parity words for detecting and correcting error words in the second frame are added to the second frame to form a Reed-Solomon code. The code errors are detected and corrected using this code. A code error rate counter is provided, and when an output of the code error counter exceeds a predetermined count, the code error correction is inhibited for a predetermined time period or until the code error rate reaches a second predetermined code error rate.

13 Claims, 12 Drawing Figures

CODE ERROR DETECTION AND CORRECTION METHOD AND APPARATUS

BACKGROUND OF THE INVENTION

The present invention relates to a code error detection and correction technique, and more particularly to method and apparatus for detecting and correcting code error of a digital audio signal suitable to microwave PCM broadcasting.

As an example of a code comprising a first frame having a plurality of words and a plurality of parity words for correcting a code error and a second frame having words of a plurality of different first frames distributed therein and having a plurality of parity words for use in detecting code errors in the second frame, a code is known which comprises a first frame having 32 data words and two parity words derived from a linearly independent generating polynomial and a second frame having 32 interleaved data words derived by interleaving words of a plurality of first frames and a 18-bit CRC (cyclic redundancy check) code for detecting an error in the second frame. The formats of the second and first frames of the code are shown in FIGS. 1 and 2, respectively.

Figure 1:
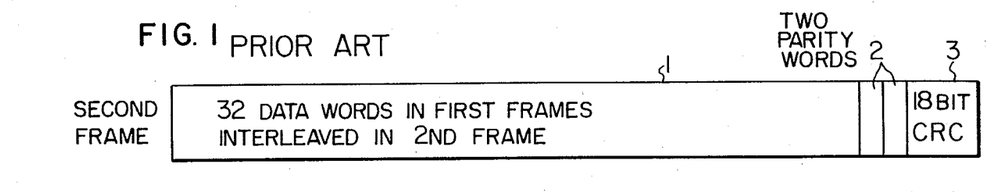
FIGS. 1 and 2 show second and first frame formats, respectively, in a prior art error detection and correction system.
Figure 2:
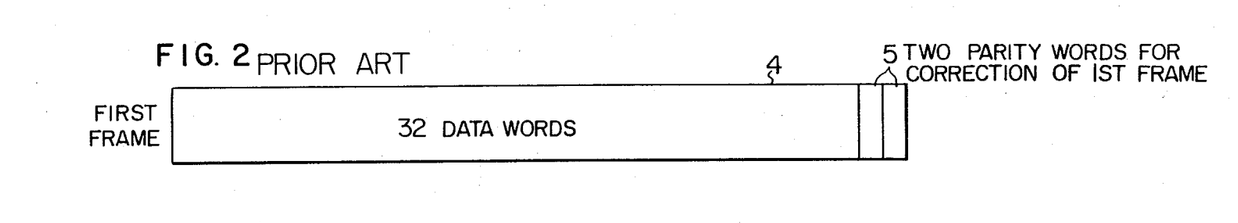

In FIG. 1, numeral 1 denotes 32 data words distributed in the second frame derived by interleaving the data words of a plurality of first frames, numeral 2 denotes two distributed (interleaved) parity words for correcting an error word in the first frame, and numeral 3 denotes the 18-bit CRC code for detecting an error in the second frame. In FIG. 2, numeral 4 denotes the 32 data words of the first frame and numeral 5 denotes the two parity words for correcting an error in the first frame.

By using the two sets of parity words and a CRC code, all errors in 18-bit burst length of the data words 1 of the second frame and in the CRC code 3 can be detected by the CRC code 3, and up to two errors existing in the first frame after de-interleaving comprising the 32 data words 4 and the linearly independent two parity words 5 can be corrected.

A decoding scheme of the code is described below. Bit errors in the second frame are detected by the CRC code 3, and if at least one bit is in error, erasure flags indicating that there is a possibility of the occurrence of an error word are added to all of the data words 1 in the second frame. Then, the words of a plurality of second frames are reconfigured to the first frame by the deinterleaving, and the linearly independent two parity words 5 in the reconfigured first frame are used to correct up to two errors.

However, in the correction by the parity words 5 of the first frame, the correction is not possible if the erasure flags have been added to three or more words of the words 4 and 5 of the first frame. In a digital audio system, an error concealment by a mean value interpolation or a previous value holding is effected.

However, in the error detection by the uncorrected CRC code, if at least one bit in the second frame is in error, the erasure bits are added to all of the words 1 and 2 in the second frame even if all other bits are correct. As a result, a probability of the inclusion of the words with the erasure flags in the deinterleaved first frame is high and hence a probability of the correction by the mean value interpolation or the previous value holding is high.

Further, in the correction by the linearly independent parity words 5 of the first frame, a circuit scale of a correction circuit is large because of a correction algorithm. Thus, in order to avoid this problem a correction operation circuit having a read-only memory (ROM) may be attempted. However, even with such a circuit, the circuit scale is still large.

An error correction method for video tape PCM recording and reproducing which has a high error correction capability for a burst error and a random error and a reduced probability for failure of error detection and incorrect error correction is disclosed in UK patent application GB No. 2,079,994A based on the Japanese patent application Nos. 55-84424, 55-84428 and 55-84427 (filed on June 20, 1980). However, in this method, the amount of serially transmitted data (1 word = 8 bits) per frames and the number of parity bits are large, an encoding/decoding circuit (error detection and correction circuit) is complex and the circuit scale is large.

In many cases, the error detection/correction codes are added to the digital audio signal in order to detect and correct the code errors. The Reed-Solomon code is suitable for the error detection/correction code from a standpoint of a code efficiency.

Figure 3:
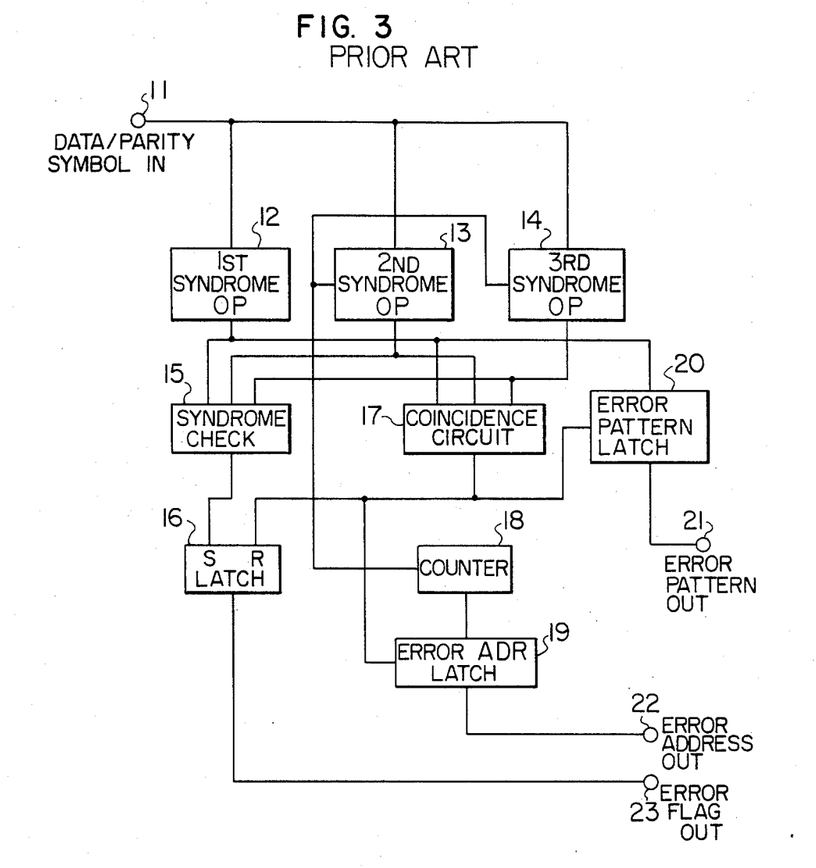
FIG. 3 shows a block diagram of a prior art code error detection and correction apparatus.

A prior art code error detection/correction system which uses the Reed-Solomon code is now explained. FIG. 3 shows a block diagram thereof. In the illustrated example, one symbol or word comprises 6 bits, and 3-symbol parity symbols are added to every 49 data symbols (one frame) to configure the Reed-Solomon code. A parity check matrix H is represented by $$H = \begin{bmatrix} 1 & 1 & 1 & 1 & \ldots & 1 & 1 & 1 \\ \alpha^{51} & \alpha^{50} & \alpha^{49} & \alpha^{48} & \ldots & \alpha^{2} & \alpha & 1 \\ \alpha^{102} & \alpha^{100} & \alpha^{98} & \alpha^{96} & \ldots & \alpha^{4} & \alpha^{2} & 1 \end{bmatrix}$$

where $\alpha$ is a root of a generating polynomial of the Reed-Solomon code.

In FIG. 3, numeral 11 denotes a data/parity symbol input terminal, numeral 12 denotes a first syndrome operation circuit, numeral 13 denotes a second syndrome operation circuit, numeral 14 denotes a third syndrome operation circuit, numeral 15 denotes a syndrome check circuit, numeral 16 denotes an R-S latch, numeral 17 denotes a coincidence circuit, numeral 18 denotes a counter, numeral 19 denotes an error address latch, numeral 20 denotes an error pattern latch, numeral 21 denotes an error pattern output terminal, numeral 22 denotes an error address output terminal and numeral 23 denotes an error flag output terminal.

Symbols applied to the data/parity symbol input terminal 11 are sequentially supplied to the first to third syndrome operation circuits 12–14. When 49 data symbols and 3 parity symbols have been applied, the first to third syndrome operation circuits 12–14 produce first to third syndromes, respectively. The syndrome check circuit 15 checks to see if all of the first to third syndromes are "0", and if at least one syndrome is not "0", the R-S latch 16 is set to set an error flag in order to indicate the detection of the code error. On the other hand, if all of the three syndromes are "0", it indicates no code error and the error flag is not set.

After the error detection, the error correction operation is started in accordance with the following algorithm. If the error is only in the i-th symbol having an error pattern $e_i$, the first to third syndromes $S_1$, $S_2$ and $S_3$ are $S_1 = e_i$ $S_2 = \alpha^{52-i} e_i$ $S_3 = \alpha^{104-2i} e_i$ $S_2$ and $S_3$ are multiplied by $\alpha^{-52}$ and $\alpha^{-104}$, respectively, and then multiplied by $\alpha$ and $\alpha^2$, respectively, by i times. Thus, we get $\alpha^{i-52} S_2 = e_i$ and $\alpha^{2i-104} S_3 = e_i$. They correspond to the value of $S_1$ or the error pattern. Thus, by checking the coincidence with $S_1$ while counting the number of times of the multiplication of $\alpha$ and $\alpha^2$ to $\alpha^{-52} S_2$ and $\alpha^{-104} S_3$, respectively, the count i at which the coincidence occurs is an address of the error symbol, and the error pattern $S_1$ or $e_i$ is determined. In this manner, the error is corrected.

In the circuit of FIG. 3, after the error detection, the second and third syndrome operation circuits 13 and 14 multiply $\alpha^{-52}$ and $\alpha^{-104}$ to the contents $S_2$ and $S_3$, respectively. Then, the counter 18 is cleared and the second and third syndrome operation circuits 13 and 14 multiply $\alpha$ and $\alpha^2$ to the contents $\alpha^{-52} S_2$ and $\alpha^{-104} S_3$, respectively. The counter 18 is counted up for every multiplication and the coincidence of the contents of the first to third syndrome operation circuits 12 to 14 is checked by the coincidence circuit 17. When the coincidence circuit 17 detects the coincidence of the contents of the first to third syndrome operation circuits 12 to 14, it produces a coincidence pulse. As a result, the R-S latch 16 is reset and the error address latch 19 latches the content of the counter 18 while the error pattern latch 20 latches the content of the first syndrome operation circuit 12. Thus, if an incorrectable error in which two or more symbols are in error is detected, an error flag is produced at the error flag output terminal 23, and if a correctable one-symbol error is detected, an error pattern is produced at the error pattern output terminal 21 and an error address is produced at the error address output terminal 22, and the error is corrected. At this time, the error flag is not produced at the error flag output terminal 23.

In the Reed-Solomon code having a code distance of four explained above, all of up to three symbol errors can be detected for the error detection only, but miscorrection (or incorrect correction) occurs for the three symbol errors if one symbol error correction is carried out. In the digital audio reproducing system, the errors are detected and corrected, and if data is incorrectable, the error concealment by the previous value holding or the mean value interpolation is effected by the error flag added to the data. However, since no error flag is added to the data not detected or incorrectly corrected, the error concealment is not effected and a click noise is generated.

In the prior art code error detection/correction apparatus described above, when a signal state is degraded and a code error rate increases and a probability of three symbol errors increases, a probability of the miscorrection increases. On the other hand, if the error correction operation is inhibited and only the error detection operation is carried out in order to prevent the miscorrection, the error correction ability of the Reed-Solomon code is not effectively utilized for a case where the code error rate is low and the error is correctable.

SUMMARY OF THE INVENTION

It is an object of the present invention to provide code error detection/correction method and apparatus which requires a low redundancy in the code, does not unduly increase words necessary for the correction and does not require a large scale circuit.

It is another object of the present invention to provide a code error detection/correction apparatus which can prevent harmful miscorrection without sacrificing the ability of the error detection/correction code.

In order to achieve the objects of the present invention, parity words are assigned by the cross-interleaving in the code error detection/correction method of the same redundancy. Instead of merely detecting the errors in the second frame, the error in the word of the second frame is detected and corrected using the Reed-Solomon code and the erasure flags which would normally be added to the words when no correction is made are not added to the other correct words as well as the corrected word in the second frame. As a result, a probability of the occurrence of the error words having the erasure flags added thereto by the previous error detection, in the first frame reconfigured after the deinterleaving, is reduced.

Instead of the error detecting CRC code, a code having the same number of bits which detects an error for each word is used to detect the error, and if a bit error occurs in less than two words of the second frame, the error word is corrected in the second frame. Accordingly, the erasure flags which would be normally added to the other correct words in the second frame are not added and hence the number of words with the erasure flags which appear in the first frame reconfigured (reconstructed) by the deinterleaving is decreased and the number of data words to be corrected is reduced. It has been found advisable to effect the data code error detection and correction by using the Reed-Solomon method and also advisable to use four parity words from the standpoint of circuit scale and correction ability.

In one aspect of the error detection/correction apparatus of the present invention, when the probability of the miscorrection is low, the correction operation is carried out, and when the signal status is deteriorated and the code error rate increases and hence the probability of the miscorrection increases, the correction operation is inhibited and only the error detection is effected. To this end, a counter for counting the number of times of error detection before the correction is provided to monitor the number of times of error detection at a predetermined time interval in order to detect the code error rate, and if it exceeds a predetermined value (preset count), the error correction operation is inhibited. When the signal status is such that a mean code error rate fluctuates around the preset count, the number of times error detection occurs is counted at a predetermined time interval to see if it exceeds or does not exceed the preset count. In order to stably prevent the miscorrection at such a code error rate, it is effective to continue the correction operation for a predetermined period after the number of times of error detection has exceeded the preset count and then inhibit the correction operation. For the same purpose, two preset counts may be set so that when the number of times of error detection exceeds the first preset count, the error correction operation is inhibited until the number of times of error detection falls below the second preset count.

DESCRIPTION OF THE PREFERRED EMBODIMENTS

Figure 4:
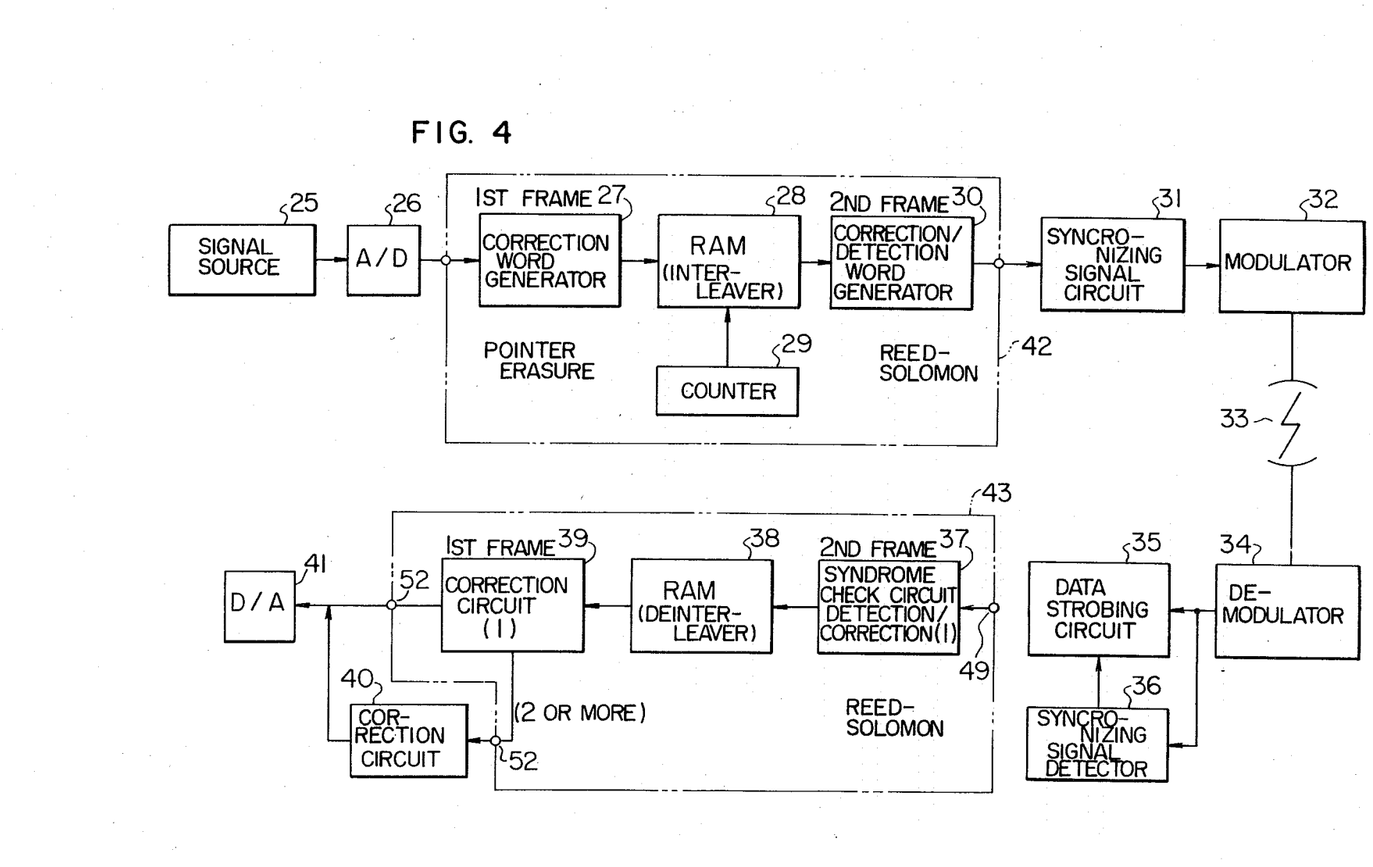
FIG. 4 shows a block diagram of the present invention applied to a digital audio broadcasting system or recording and reproducing system.

FIG. 4 shows an overall configuration of a PCM digital data broadcasting system to which the present invention is applied. At a transmitting station, an analog signal from a signal source 25 such as an audio signal source is converted to a digital data sequence signal by an A/D converter 26. Pointer erasure correction words are generated from the data sequence signal by a first frame correction word generator 27. The first frame signal is interleaved by an interleaver comprising a RAM 28 and a counter 29, and the interleaved signal is encoded by, for example, the Reed-Solomon code in a second frame correction/detection word generator 30. A synchronizing signal is added to the encoded data sequence signal in a synchronizing signal circuit 31, and they are PCM-modulated by a modulator 32 and transmitted to a receiving station through, for example, microwave transmitting means 33.

At the receiving station, the received signal is demodulated by a demodulator 34, the synchronizing signal is detected by a synchronizing signal detector 35 and the demodulated signal is reshaped in a data strobing circuit 36 in synchronism with the detected synchronizing signal to produce a digital data sequence signal. The data is then supplied to a syndrome check circuit 37 to detect and correct errors in the second frame and the output signal of the syndrome check circuit 37 is supplied to a deinterleaver 38 comprising a RAM. When an entire frame of one data block has been written into the RAM 38, the data is read out of the RAM 38 and a one-word error in the first frame is corrected by an error correction circuit 39. The corrected data is converted to an analog signal by a D/A converter 41. When errors in for example, two or more words, which cannot be corrected by the correction circuit 39, are detected, a flag is added to the data and the data is corrected by the interpolation or the previous value holding in a correction circuit 40 and the corrected data is supplied to the D/A converter 41. In this manner, the input source signal is reproduced at the output of the D/A converter 41. Blocks 42 and 43 represent an encoding unit and a decoding unit in the transmitting station and the receiving station (or a recording unit and a reproducing unit), respectively, for the error detection and correction. A detail of the decoding unit 43 will be explained later. The present system can be used as a data recording and reproducing apparatus. When a magnetic tape is used as the transmitting means 33, a recording head and a reproducing head are used, as will be apparent to those skilled in the art.

As an example, let us consider a code format which comprises a first frame having 32 data words and one parity word for correcting one data word error by the pointer erasure method, and a second frame having 32 data words and one parity word distributed by interleaving the words of a plurality of first frames and four parity words for detecting and correcting errors in the 33 words of the second frame so that (37, 33) Reed-Solomon code is formed.

Figure 5:
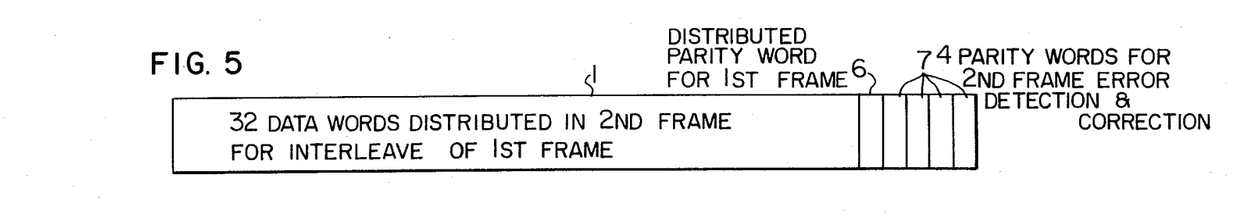
FIGS. 5 and 6 show second and first frame formats, respectively, in an error detection and correction method of the present invention.
Figure 6:
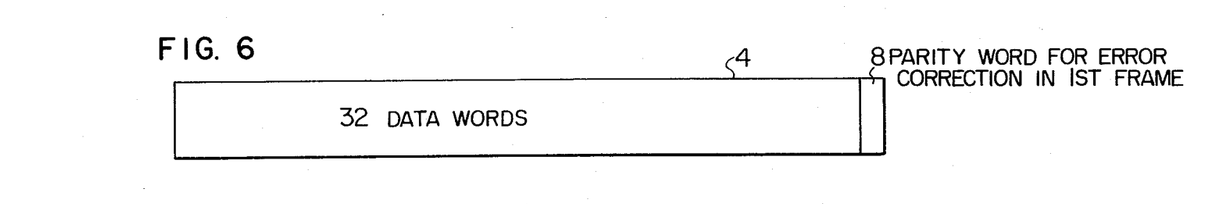

The second and first frame formats of the code are shown in FIGS. 5 and 6, respectively.

In FIG. 5, numeral 1 denotes the 32 data words distributed by interleaving the data words of the plurality of first frames (where one word comprises 6 bits), numeral 6 denotes the one parity word distributed by the interleaving, for correcting the error in the first frame, and numeral 7 denotes the four parity words for detecting and correcting the errors in the second frame.

In FIG. 6, numeral 4 denotes the 32 data words and numeral 8 denotes the parity word for correcting the error in the first frame.

A decoding method of the code is now explained with reference to FIG. 7, in which numeral 49 denotes a data input terminal similar to that shown in FIG. 4, numeral 50 denotes a multiplexer, numeral 51 denotes a random access memory, numeral 52 denotes a data output terminal, numeral 53 denotes a correction control terminal, numeral 54 denotes a counter, numerals 55–58 denote first to fourth syndrome operation circuits, numeral 59 denotes a multiplexer, numeral 60 denotes a syndrome check circuit, numeral 61 denotes a coincidence circuit, numeral 62 denotes an error pattern latch, numeral 63 denotes Ex-OR gates, numeral 64 denotes an R-S latch, numeral 65 denotes a counter, numeral 66 denotes an error address latch and numeral 67 denotes an error address output terminal.

In decoding, the 37 words 1, 6 and 7 of the second frame of FIG. 5 are applied to the input terminal 49. If the second frame includes no error, the results of operation by the syndrome operation circuits 55–58 are supplied to the syndrome check circuit 60 which determines no error. The same words 1, 6 and 7 of the second frame as those previously applied are again applied to the data input terminal 49 and they are stored in the random access memory 51. If only one word of the second frame is in error, the syndrome check circuit 60 detects the error based on the results of operation by the syndrome operation circuits 55–58 and an address of the error word and an error pattern are determined. The same data of the second frame is again applied to the data input terminal 49 and when the error word is written into the random access memory 51, an error word correction word for correcting the error word by the EX-OR gates 63 is produced by the error word latch 62. The input error word and the error word correction word are supplied to the EX-OR gates 63 through the multiplexer 59 so that the error is corrected. Only when the error word is supplied, the error word is replaced by the corrected word by the switching by the multiplexer 50. When the second frame having errors in two or more words is supplied, the syndrome check circuit 60 detects the errors based on the results of operation by the syndrome operation circuits 55-58 and the R-S latch 64 is set. The R-S latch 64 produces a signal to add an erasure flag to each of the words, and when the same data of the second frame is applied to the data input terminal 49, signals representing the erasure flags are added thereto through the multiplexer 50 and the data is stored in the random access memory 51. The operation of the circuit for error detection and correction of the (37, 33) Reed-Solomon code has thus been described. Since the one-word error is corrected, a probability of the addition of the erasure flags to the words 1 and 6 of the second frame is reduced. Following the above operation, the correction operation for the first frame is carried out. Prior to the correction operation, the data words stored in the random access memory 51 are read out while address data supplied to the random access memory 51 is offset to deinterleave the data words so that the 33 distributed words are reconfigured as the first frame.

The reconfigured first frame data 4 and 8 are then read out of the random access memory 51 and supplied to the counter 54, and they are also operated on in the syndrome operation circuit 55. The first frame is corrected in the counter 54 by the pointer erasure method. The number of deinterleaved words with the erasure flags in the first frame is counted, and if the count is zero, no correction is made and the same data 4 and 8 of the first frame is again read out of the random access memory 51 and supplied to the D/A converter 41 of FIG. 4 through the output terminal 52. If the count of the counter 54 is one, an error correction word is generated by the syndrome operation circuit 55, and when the same data 4 and 8 of the first frame is again read out of the random access memory 51, the error word latch 62 which latches the error correction word produces the error correction word and it is supplied to the EX-OR gates 63 together with the word with the erasure flag through the multiplexer 59 to correct the error, and the corrected word is replaced for the word with the erasure flag. If the count of the erasure flag counter 54 is two or more, no correction is made and the erasure flags are retained and the same data 4 and 8 of the first frame is again read out of the random access memory 51 and supplied to the correction circuit 40 of FIG. 4 through the output terminal 52.

In this manner, the error detection and correction is carried out by the (37, 33) Reed-Solomon code. Since the chance of error correction increases as compared with the prior art method because of the correction by the pointer erasure method after the deinterleaving, the number of error words contained in the second frame decreases and the probability of correction also decreases.

When the correction by the Reed-Solomon method and the pointer erasure method is carried out in accordance with the above algorithm, a portion of the circuit can be shared and hence the circuit scale is reduced.

Figure 8:
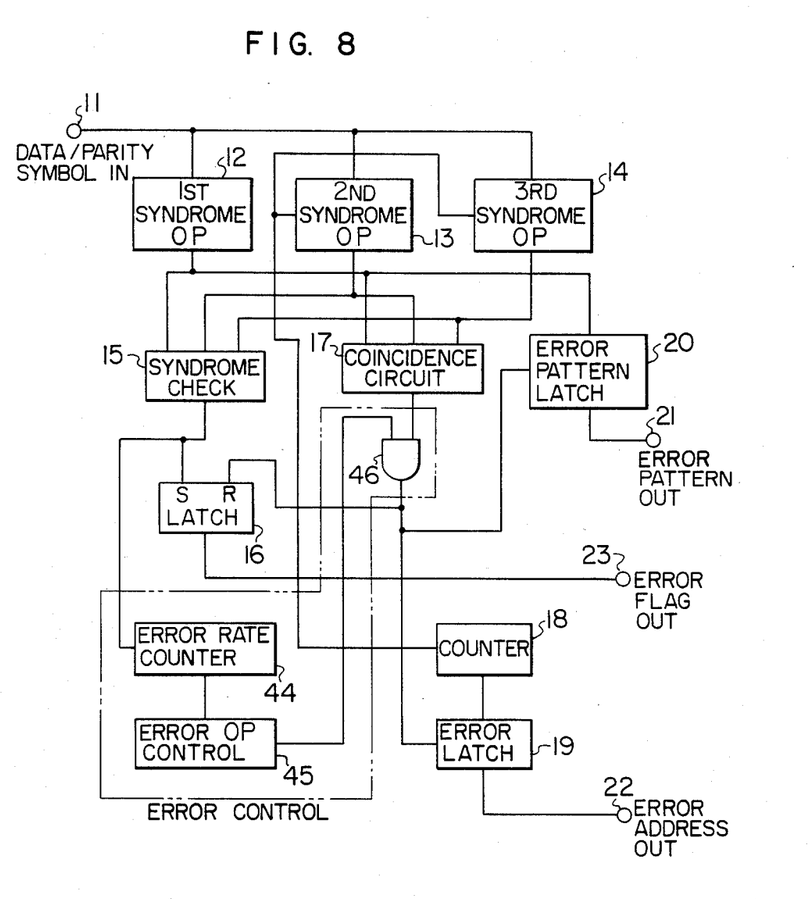
FIG. 8 shows an embodiment of the code error detection and correction apparatus of the present invention.

One embodiment of the error detection and correction apparatus of the present invention is explained with reference to FIG. 8, in which numeral 11 denotes a data/parity symbol input terminal, numeral 12 denotes a first syndrome operation circuit, numeral 13 denotes a second syndrome operation circuit, numeral 14 denotes a third syndrome operation circuit, numeral 15 denotes a syndrome check circuit, numeral 16 denotes an R-S latch, numeral 17 denotes a coincidence circuit, numeral 18 denotes a counter, numeral 19 denotes an error address latch, numeral 20 denotes an error pattern latch, numeral 21 denotes an error pattern output terminal, numeral 22 denotes an error address output terminal, numeral 23 denotes an error flag output terminal, numeral 44 denotes an error rate counter for counting errors occurred in each given period, e.g. one sec., numeral 45 denotes a correction control circuit and numeral 46 denotes an AND gate.

In the present embodiment, the teaching of the present invention is applied to a code error detection and correction apparatus which uses a Reed-Solomon code having three parity symbols for 49 data symbols with one symbol consisting of six bits. The symbol applied to the data/parity symbol input terminal 11 is sequentially supplied to the first to third syndrome operation circuits 12-14. When the 49 data symbols and the 3 parity symbols have been applied, the first to third syndrome operation circuits 12-14 produce first to third syndromes, respectively. The syndrome check circuit 15 checks to see if all of the first to third syndromes are zero, and if at least one of the syndromes is not zero, the R-S latch 16 is set to indicate the code error and an error detection pulse is supplied to the error rate counter 44. If all of the syndromes are zero, the R-S latch 16 is not set and no error detection pulse is supplied to the error rate counter 44.

When the errors have been detected, the error correction operation is started. The correction algorithm itself is identical to that of the prior art error detection and correction apparatus. The second and third syndrome operation circuits 13 and 14 multiply $\alpha^{-52}$ and $\alpha^{-104}$ to the contents $S_2$ and $S_4$ thereof, respectively. The counter 18 is then cleared and the second and third syndrome operation circuits 13 and 14 multiply $\alpha$ and $\alpha^2$ to the contents thereof, that is, $\alpha^{-52}S_2$ and $\alpha^{-104}S_3$, respectively. At every multiplication, the counter 18 is incremented and the coincidence of the contents of the first to third syndrome operation circuits 12-14 are checked by the coincidence circuit 17. When the coincidence circuit 17 detects the coincidence of the contents of the first to third syndrome operation circuits 12-14, it produces a coincidence pulse.

Figure 9:
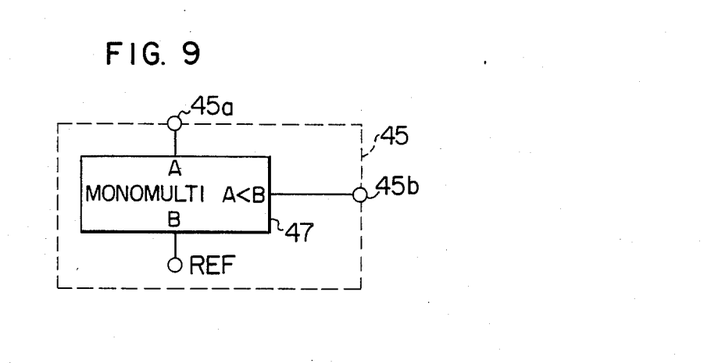
FIGS. 9 to 11 show configurations of a correction control circuit in FIG. 8.
Figure 10:
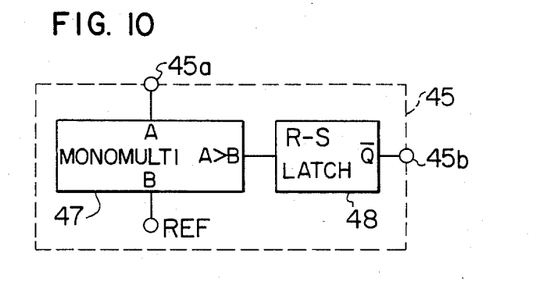
Figure 11:
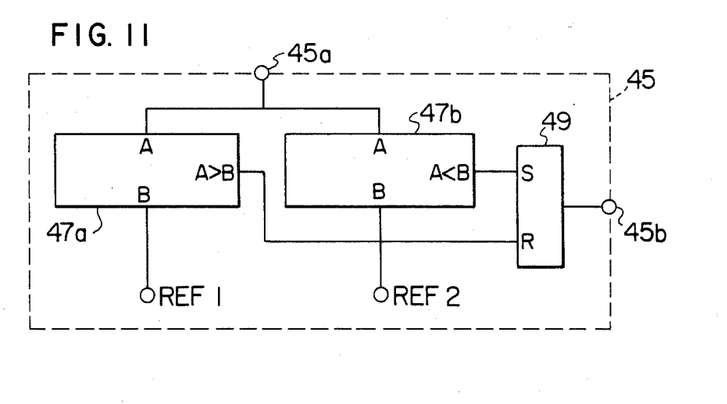

On the other hand, the error rate counter 44 counts the number of error detection pulses from the syndrome check circuit 15 in a predetermined period and outputs the count at every cycle. Thus, the output of the error rate counter 44 is proportional to the code error rate. The output of the error rate counter 44 is supplied to the correction control circuit 45. FIGS. 9-11 show block diagrams of the correction control circuit 45. In FIGS. 9-11, numeral 45a denotes an error rate input terminal, numeral 45b denotes a control output terminal, numerals 47, 47a and 47b denote comparators, numeral 48 denotes a monostable multivibrator and numeral 49 denotes an R-S latch. In FIG. 9, the output of the error rate counter 44 applied to the error rate input terminal 45a is supplied to the comparator 47 where it is compared with a preset reference, and if the error rate input is smaller than the reference, the comparator 47 produces a low level output at the control output terminal 45b, and if the error rate input is larger than the reference, the comparator produces a high level output. In FIG. 10, the output of the error rate counter 44 applied to the error rate input terminal 45a is compared with a reference by the comparator 47, and if the error rate input is larger than the reference, the monostable multivibrator 48 is triggered. Accordingly, after the error rate input has exceeded the reference, the monostable multivibrator 48 produces a low level output at the control output terminal 45b for a predetermined period, and produces a high level output during the other period. In FIG. 11, the output of the error rate counter 44 applied to the error rate input terminal 45a is supplied to the comparator 47a and the comparator 47b. The comparator 47a compares the error rate input with a REF1 and if the error rate input is larger than the REF1, it resets the R-S latch 49. On the other hand, the comparator 47b compares the error rate input with a REF2, and if the error rate input is smaller than the REF2, it sets the R-S latch 49. The REF2 is smaller than the REF1. In the present embodiment, when the error rate input is larger than the REF1, the output of the control output terminal 45b is at the low level and it remains at the low level until the error rate input falls below the REF2 even if the error rate input fluctuates. When the error rate input exceeds the REF2, the output of the control output terminal 45b assumes high level.

The operation of the circuit is explained with reference to FIG. 8. The output of the correction control circuit 45 is supplied to the AND gate 46 to turn on and off the output of the coincidence circuit 17. If the code error rate of the input signal is so low that it is below the reference, the coincidence pulse is gated by the AND gate 46 and the R-S latch 16 is reset and the error address latch 19 latches the content of the counter 18 while the error pattern latch 20 latches the content of the first syndrome operation circuit 12. On the other hand, if the code error rate of the input signal is so high that it exceeds the reference, the coincidence pulse is not gated by the AND gate 46, the R-S latch 16 is not reset and the error address latch 19 and the error pattern latch 20 are not activated. Thus, only the error detection is effected. If an error is detected and the error is correctable, an error pattern is produced at the error pattern output terminal 21 and an error address is produced at the error address output terminal 22, and if an incorrectable error is detected or the error correction is inhibited, an error flag is produced at the error flag output terminal 23.

Accordingly, by setting the reference at a level corresponding to the code error rate at which the probability of the miscorrection is critical, only the error detection is effected when the error rate is higher so that the miscorrection is prevented, and the error correction is effected when the error rate is not critical for the miscorrection.

Figure 7:
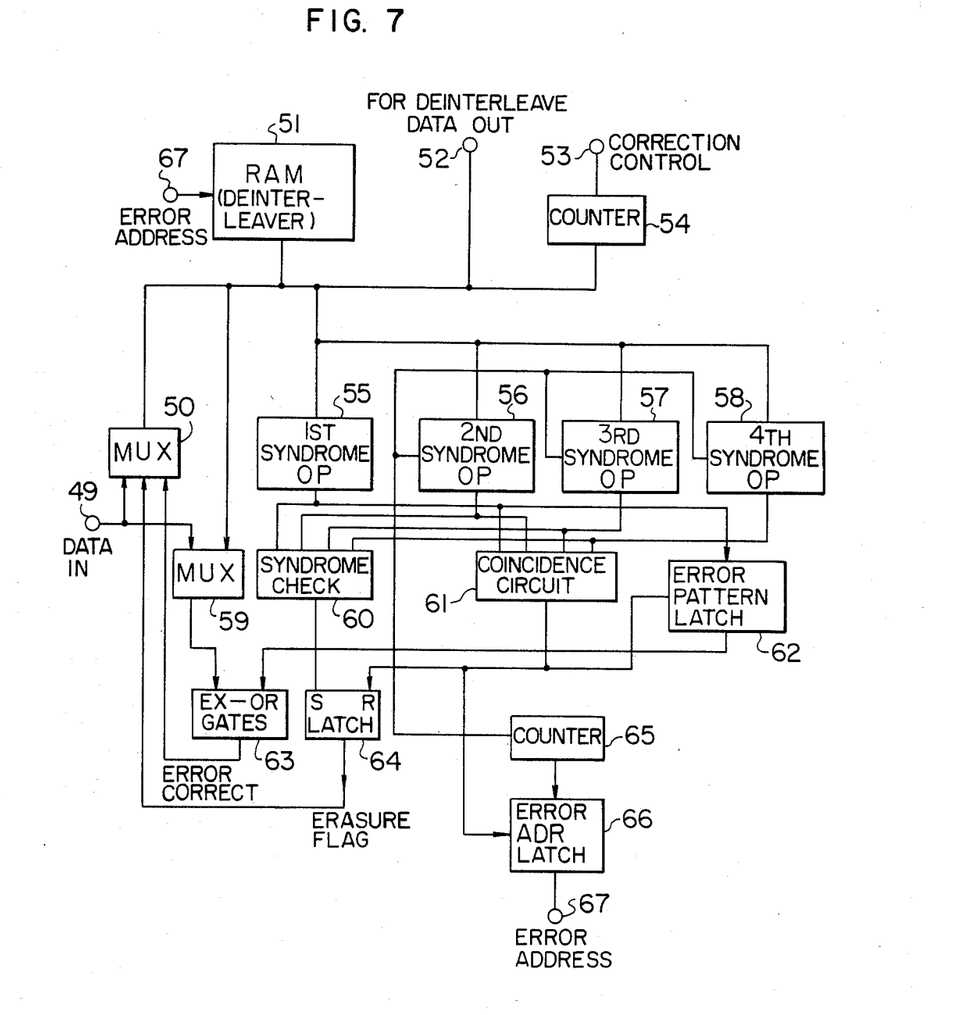
FIG. 7 shows a block diagram of an apparatus for implementing the code error detection and correction method of the present invention.
Figure 12:
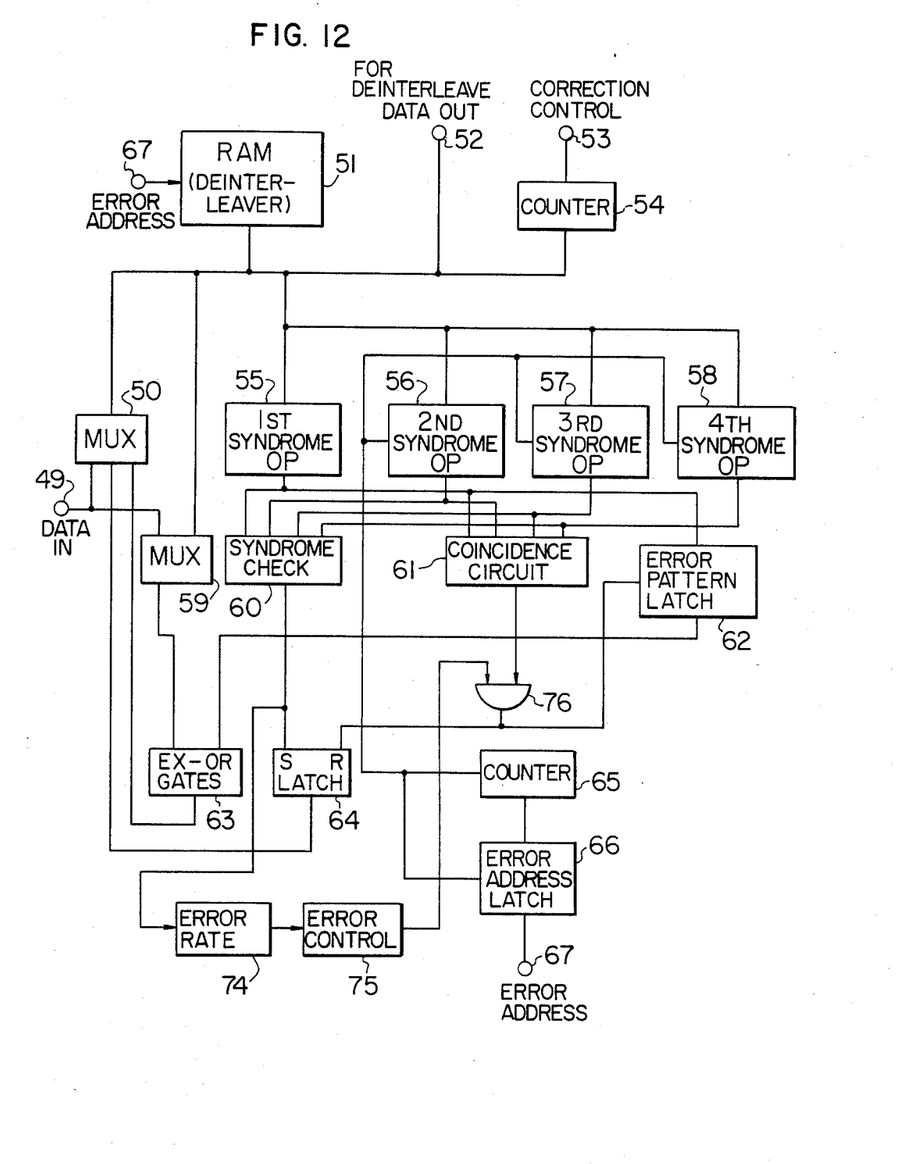
FIG. 12 shows a block diagram of another embodiment of the present invention.

FIG. 12 shows another embodiment of the present invention, in which an error counter 74 and, a correction control circuit 75 and an AND gate 76 as shown in FIGS. 9-11 are added to the configuration of FIG. 7.

We claim:

1. A method for correcting errors for a code comprising a first error correction block having words each belonging to one of a plurality of channels of PCM data sequence in a first arrangement and a first parity word thereafter, and a second error correction block having words each belonging to one of a plurality of channels of PCM data sequence and said first parity word in a second arrangement and second parity words therefor, said second arrangement of sequence being derived by delaying said first arrangement of data sequence and said first parity word by different time period for each channel, said second error correction block being an error detection and correction code having the ability to correct errors in up to k words (k is an integer) in one block by operating error syndromes and determining error locations based on the error syndromes, said first error correction block having the parity word capable of correcting one error word in one block by operating error syndromes, said method comprising the steps of:

(a) decoding said second error correction block delaying said plurality of channels of PCM data sequence in said first arrangement and said first parity word by a different time period for each channel to reconfigure them into said first arrangement, correcting errors in not more than k words in said second error correction block, and when errors in no less than k words are detected, adding an error pointer to each of the words to regard that all of the words in said block are in error; and (b) decoding said first error correction block, operating error syndrome based on the words contained in said first error correction block, determining an error pattern based on said error syndromes, and correcting the error only when said first error correction block contains only one word which is in error or regarded as in error and which has been delayed in said second error correction block and has the error pointer added thereto.

2. A method for correcting errors according to claim 1, wherein said error detection and correction code is a b-adjacent code.

3. A method for correcting errors according to claim 2 wherein said second error correction block has four parity words for detecting and correcting the errors in the words of said second error correction block.

4. A method for correcting errors according to claim 1 wherein said k is 2.

5. A method for correcting errors according to claim 1, wherein said error detection and correction code is a Reed-Solomon code.

6. An apparatus for correcting code errors in a digital signal received from a signal source, in which the code comprises a first error correcting block having words each belonging to one of a plurality of channels of a digital data sequence in a first arrangement and a parity word therefor and a second error correction block having words each belonging to one of a plurality of channels of a digital data sequence and said first parity word in a second arrangement and second parity words therefor, said second arrangement of the digital data sequence being derived by delaying said first arrangement of the data sequence and said first parity word by different time periods for each channel, said second error correction block being an error detection and correction code capable of correcting errors in up to k words (k is an integer) in one block by operating error syndromes and determining error locations based on the error syndrome, said first error correction block having a parity word capable of correcting one error word in one block by operating error syndromes, said apparatus comprising:

(a) first error syndrome and error pattern generating means for operating error syndromes based on the words contained in said second error correction block received from said signal source and for determining an error pattern based on the error syndrome therefrom;

(b) error detecting and correcting means responsive to said first error syndrome and error pattern generating means for detecting errors and correcting ones of said errors in an amount of not more than k words in said second correction block and adding an error pointer to each of the words to indicate that all of the words in said block are in error when the errors in no less than k words are detected;

(c) de-interleave means responsive to said digital signal subject to the error detection and correction by said error detecting and correcting means for delaying said plurality of channels of the digital data sequence in said first arrangement and said parity word by different time periods for each channel to reconfigure them into said first arrangement;

(d) second error syndrome and error pattern generating means for operating error syndromes based on the words contained in said first error correction block from said de-interleave means and for determining an error pattern based on said error syndromes therefrom; and (e) error correcting means responsive to said error pattern and said error syndromes from said second error syndrome and error pattern generating means for correcting the error only when said first error correction block contains only one word which is in error or regarded as in error and which has been delayed in said second error correction block and has the error pointer added thereto.

7. The apparatus according to claim 6, wherein said error detection and correction code is a b-adjacent code.

8. The apparatus according to claim 6, wherein said error detection and correction code is a Reed-Solomon code.

9. The apparatus according to claim 6, wherein said first and said second error syndrome and error pattern generating means are shared.

10. An apparatus for detecting and correcting code errors in a digital signal according to claim 6, further comprising:

counter means coupled to the output of said first error syndrome and error pattern generating means for counting a code error rate of an input signal; and control means for controlling an error correction operation said control means being switched by the output of said counter means so that the code error correction operation is enabled or inhibited depending on the code error rate of the input signal.

11. An apparatus for detecting and correcting code errors according to claim 10 wherein said control means includes means for inhibiting the error correction operation for a predetermined time period from an instant when the output of said counter means exceeds a preset code error rate, said input signal representing a result of an error syndrome operation for error correction block data comprising a PCM data sequence and a parity word sequence.

12. An apparatus for detecting and correcting code errors according to claim 10 wherein said control means includes means for inhibiting the error correction operation when the output of said counter means exceeds a first preset code error rate and resumes the error correction operation when the output of said counter means falls below a second preset code error rate smaller than said first preset code error rate.

13. In an apparatus for correcting errors for a code in a digital signal inputted in time series sequence, said code comprising an error detection and correction block having words or bits each belonging to one of a plurality of channels of a digital data sequence and a parity word or parity bit therefor, said error detection and correction block being a b-adjacent code or a Reed-Solomon code for correcting errors of up to k words or k bits (k is an integer) in one block by operating error syndromes through an error syndrome operation circuit and determining error locations based on the error syndromes, comprising:

decoder means for decoding said error detection and correction block from said input digital signal;

error detection and correction means for correcting errors in not more than k words or bits in said error detection and correction block from said decoder means;

error identifying means for adding an error pointer to each of the words or bits to indicate that all of the words or bits in said block are in error when errors in no less than k words or bits are detected by said error detection and correction means; and an error syndrome circuit including means for generating a correction operation executed signal when an error correction operation is made for the error detection and correction block;

said error correcting apparatus comprising (a) syndrome check means coupled to said error syndrome circuit for generating a signal representing occurrence of an error or an incorrectable error for the error detection and correction block when the result of the error syndrome operations from said error syndrome circuit indicates errors exceeding k words or bits in the decoding;

(b) error measuring means coupled to the output of said syndrome check means for measuring said signal representing occurrence of an error or an incorrectable error; and (c) correction operation control means responsive to the output of said error measuring means or said correction-executed signal for controlling the operation of error correction so that the code error correction operation is enabled or inhibited.

* * * * *